(12) United States Patent
Jaffrennou et al.

(10) Patent No.: US 9,868,132 B2
(45) Date of Patent: Jan. 16, 2018

(54) DIE FOR DEPOSITING AT LEAST ONE CONDUCTIVE FLUID ONTO A SUBSTRATE, AND DEVICE INCLUDING SUCH A MATRIX AND DEPOSITION METHOD

(71) Applicant: Total Marketing Services, Puteaux (FR)

(72) Inventors: Périne Jaffrennou, Brussels (BE); Benoit Lombardet, Saint Alban de la Roche (FR)

(73) Assignee: Total Marketing Services, Puteaux (FR)

( * ) Notice: Subject to any disclaimer, the term of this patent is extended or adjusted under 35 U.S.C. 154(b) by 38 days.

(21) Appl. No.: 14/397,712

(22) PCT Filed: Apr. 26, 2013

(86) PCT No.: PCT/EP2013/058814
§ 371 (c)(1),
(2) Date: Oct. 29, 2014

(87) PCT Pub. No.: WO2013/164284
PCT Pub. Date: Nov. 7, 2013

(65) Prior Publication Data
US 2015/0122174 A1   May 7, 2015

(30) Foreign Application Priority Data
Apr. 30, 2012   (FR) ...................... 12 01262

(51) Int. Cl.
*B41J 2/14* (2006.01)
*B41J 2/04* (2006.01)
(Continued)

(52) U.S. Cl.
CPC ......... *B05C 21/005* (2013.01); *B41J 2/14451* (2013.01); *H01L 31/022425* (2013.01);
(Continued)

(58) Field of Classification Search
None
See application file for complete search history.

(56) References Cited

U.S. PATENT DOCUMENTS 4,312,009 A * 1/1982 Lange ...................... B41J 2/155
250/316.1
4,745,416 A * 5/1988 Horihata ............ G02B 27/0018
347/259

(Continued)

FOREIGN PATENT DOCUMENTS

CN   1144745 A   3/1997
CN   1603114 A   4/2005
(Continued)

OTHER PUBLICATIONS

PCT International Search Report of the ISA dated Jul. 9, 2013 for PCT/EP2013/058814, 7 pages.

*Primary Examiner* — Binu Thomas
(74) *Attorney, Agent, or Firm* — Daly, Crowley, Mofford & Durkee, LLP

(57) ABSTRACT

The invention relates to a die for depositing a conductive fluid onto a substrate, including a structure (11) for supporting at least one fluid (13) which is conductive and the viscosity of which sensitive to the radiation from a light source (5), in order to deposit said fluid (13) onto a substrate (3) so as to form conductive contacts or tracks on the substrate (3). The support structure (11) includes at least one tank (17) for said conductive fluid, the bottom wall (19) of which is to be arranged opposite said substrate (3) during the deposition, and said bottom wall (19) has perforations for enabling the flow (18) of said conductive fluid (13) onto the substrate (3) when said fluid (13) is subjected to the radiation (15) from said light source (5), wherein the perforations are formed according to a pattern of the fluid to be deposited onto the substrate (3). The die (7) further comprises an (Continued)

optical plate (9) having a pattern (30) pervious to the radiation from said light source (5), the optical plate (9) being impervious to the radiation from said light source (5) outside said pattern (30), while the pattern (30) pervious to the radiation from said light source on said optical plate (9) corresponds to a pattern covering the pattern (22) of the perforations of said support structure.

23 Claims, 5 Drawing Sheets

(51) Int. Cl.
  *B05C 21/00* (2006.01)
  *H01L 31/0224* (2006.01)
  *B41M 5/00* (2006.01)
  *B41J 2/07* (2006.01)
(52) U.S. Cl.
  CPC .............. *B41J 2/07* (2013.01); *B41J 2/14104* (2013.01); *B41M 5/0023* (2013.01); *Y02E 10/50* (2013.01)

(56) References Cited

U.S. PATENT DOCUMENTS

| | | | |
|---|---|---|---|
| 5,713,673 A * | 2/1998 | Nemoto | B41J 2/2103 347/43 |
| 5,745,128 A | 4/1998 | Lam et al. | |
| 6,135,586 A * | 10/2000 | McClelland | B41J 2/155 347/42 |
| 6,270,194 B1 * | 8/2001 | Maximovsky | B41J 2/01 347/51 |
| 6,270,197 B1 * | 8/2001 | Ahn | B41J 2/14064 347/63 |
| 6,867,795 B1 | 3/2005 | Wareberg et al. | |
| 2004/0032459 A1 | 2/2004 | Te | |
| 2004/0261700 A1 * | 12/2004 | Edwards | B25B 11/005 118/679 |
| 2008/0117255 A1 * | 5/2008 | Cannon | B41J 2/14104 347/44 |
| 2011/0038974 A1 * | 2/2011 | Schroder | B82Y 30/00 425/78 |

FOREIGN PATENT DOCUMENTS

| | | |
|---|---|---|
| CN | 1612809 A | 5/2005 |
| CN | 1615222 A | 5/2005 |
| CN | 101107128 A | 1/2008 |
| CN | 101128321 A | 2/2008 |
| CN | 101218102 A | 7/2008 |
| DE | 19915666 A1 | 10/2000 |
| DE | 10 2009 059 042.0 | 12/2009 |
| DE | 10 2009 059 042 A1 | 6/2011 |
| EP | 0 600 712 A2 | 6/1994 |
| JP | 2008173968 A | 7/2008 |
| WO | WO 2011/070079 A1 | 6/2011 |

* cited by examiner

DIE FOR DEPOSITING AT LEAST ONE CONDUCTIVE FLUID ONTO A SUBSTRATE, AND DEVICE INCLUDING SUCH A MATRIX AND DEPOSITION METHOD

This application is a U.S. National Stage of PCT application PCT/EP2013/058814 filed in the French language on Apr. 26, 2013, and entitled "DIE FOR DEPOSITING AT LEAST ONE CONDUCTIVE FLUID ONTO A SUBSTRATE, AND DEVICE INCLUDING SUCH A MATRIX AND DEPOSITION METHOD," which claims priority to French application FR1201262 filed Apr. 30, 2012, which is incorporated herein by reference.

The invention relates to a matrix for depositing at least one conductive fluid on a substrate, and to a device comprising this deposition matrix and to a deposition process.

The invention more particularly applies to the production of metallizations and to the formation of metal contacts, especially in the field of photovoltaic cells or interconnects between photovoltaic panels.

Among the metallization methods currently used for solar cells to produce localized contacts, screen printing methods or laser deposition methods are for example known.

The method most commonly used in the production of photovoltaic cells to produce metal contacts is screen printing.

This method consists in depositing Ag or Al by forcing a metal paste based on Ag or Al through a structured screen. Despite its low cost and high production rate, this method has many drawbacks: it consumes a large amount of paste (minimum deposit thickness of 10 µm and residual deposit on the screen). In addition, this method requires contact to be made with the substrate and a mechanical pressure to be applied, thereby increasing the risk of breakage and precluding any use on thin substrates. Lastly, the width of the metallization lines is limited by the size of the apertures in the screen (~100 µm minimum), and in order to avoid substantial resistive losses these metal contacts may have to be produced in a number of passes.

Another known method uses an aerosol jet to produce these metal contacts.

During the deposition, the metal is deposited in the form of a spray. The head from which the metal, initially in the form of an ink, is sprayed may be moved over the substrate in order to produce localized contacts having any type of structure/pattern. The metal tracks produced have a narrow line width (~50 µm) and not very much metal is consumed.

However, since the metal is deposited from a single head, the throughput and speed of production of the metal contacts are not currently high enough to be implemented in an industrial production process.

Moreover, in this method the alignment of and movement between the header ejecting the metal spray and the substrate is critical. Specifically, this alignment and the movement of the ejection head must be very precise (the error in the movement of the head must be small relative to the size of the metallization lines) in order not to decrease photovoltaic cell yield. However, such an alignment requires expensive technical means and requires quite a long time, thereby decreasing photovoltaic cell production rate by a corresponding amount.

Yet another suggested approach is termed the laser fired contact approach, as described in document WO0060674.

This method makes it possible to produce localized contacts for a solar cell. The substrate is first metalized on the wafer scale then a laser beam is focused on precise points in order to locally heat this metalized surface, in order to produce Al/Si alloy-based contacts. The movement of the laser beam allows any type of structure/pattern to be produced. The quality of the contact and the degradation of the silicon may be controlled by way of carefully selected laser parameters. Since this process employs a wafer scale metallization it cannot be used for cell architectures using back contacts.

Lastly, the companies BASF, SCHMID and Aurentum have developed a laser transfer printing machine and specific water-based inks, for example silver or aluminum inks, sold under the name Cyposol™L, for producing localized contacts for solar cells. In principle, laser transfer printing involves an endless belt that is coated with a viscous ink containing the metal to be deposited on the substrate, the semiconductor wafer. This belt runs above the substrate and a laser beam is directed onto the belt on the side opposite that facing the substrate, which results in the ink being ejected under the action of the laser-beam onto the substrate, thus producing a metal contact.

The viscosity of these inks is such that, by capillary action, the ink remains stuck to the belt under standard conditions and is ejected under the action of the laser in order to be deposited on the substrate.

This process is continuous: during the process, the viscosity of the ink is controlled and adjusted and the belt is run non-stop. The belt is permeable to the wavelength of the laser used to eject the metal.

This process is based on the laser-induced forward transfer (LIFT) principle, mainly used in biology, which consists in ejecting, under the action of a laser, any viscous material deposited on a holder.

According to the above companies, metallization lines of diameter lower than 60 µm may be produced (see for example "30 µm wide contacts on silicon cells by laser transfer" T. C. Roder, E. Hoffman, J. R. Kohler, J. H. Werner—Hawaii conference IEEE 2010).

However, the latter process is also delicate given the required alignment of the laser, the required precision of the laser beam movement, etc., so that its industrial application would appear to be difficult.

In the field of ink transfer printing machines, document U.S. Pat. No. 5,745,128 describes a printing device comprising a transfer matrix for transferring ink onto paper using the viscosity effect. However, the ink used in this device is not conductive and the device is not used to produce conductive tracks on a substrate such as in the present invention.

The present invention aims to provide a simpler and less expensive device and process allowing narrow metal contacts to be produced on a substrate, in particular for producing the metal contacts of photovoltaic cells.

For this purpose, one subject of the invention is a matrix for depositing a conductive fluid on a substrate comprising a structure for holding at least one fluid that is conductive and has a viscosity sensitive to radiation from a light source for depositing said fluid on a substrate in order to form conductive tracks or contacts on the substrate, in which the holding structure comprises at least one reservoir for said conductive fluid a bottom wall of which is intended to be placed facing said substrate during the deposition and in that said bottom wall contains perforations allowing said conductive fluid to flow onto the substrate when said fluid is exposed to radiation from said light source, the perforations being produced according to a pattern of the fluid to be deposited on the substrate, characterized in that the deposition matrix furthermore comprises an optical plate having a pattern permeable to radiation from said light source, the optical plate being impermeable to radiation from said light source beyond said pattern, the pattern permeable to radiation from said light source, of said optical plate corresponding to a pattern covering the pattern of the perforations in said holding structure.

Thus, a deposition rate comparable to that of screen printing may be achieved while a good metal contact conductivity is obtained. In addition, narrower metal contacts are obtained reproducibly.

Furthermore, by virtue of the presence of the optical plate containing patterns covering the pattern of the perforations, it is possible to control the light radiation that activates the conductive fluid. In particular, the optical plate allows the light radiation that activates the conductive fluid to be patterned. For example, the optical plate may be coated with a filtering coating (especially in the form of optical filters) level with the pattern permeable to radiation from said light source. Using a filtering coating the properties of which vary in different zones of the permeable pattern of the optical plate therefore allows the properties of the light radiation received by the conductive fluid to be modified. This especially makes it possible to use the same deposition device with a number of types of conductive fluids (contained in a number of conductive fluid reservoirs) without modifying the light source itself (since the properties of the light radiation received by the conductive fluid are modified by way of the properties of the permeable pattern of the optical plate). According to the invention, the use of the optical plate containing patterns covering the pattern of the perforations therefore makes it possible to improve control of the activation of the conductive fluid, while guaranteeing a good alignment of the light source.

According to one embodiment of the invention, the optical plate forms the upper portion of said holding structure so as to obtain a closed reservoir. This embodiment has the advantage of delivering an integrated device in which the optical plate is directly integrated into the reservoir.

According to another embodiment of the invention, the optical plate is placed above said holding structure. In other words, the optical plate does not close the holding structure and it forms a part separate from the holding structure. In this case, the reservoirs of the holding structure may be open-topped (or permeable to the light radiation). By virtue of this embodiment, it is possible to keep the optical plate and the light source fixed relative to each other and to position various reservoirs under the optical plate. It is therefore possible, depending on the pattern of the optical plate covering the patterns of perforations in the holding structure, to treat various types of conductive fluids with the same optical plate/light source assembly.

According to other features applied individually or in combination:

According to one aspect, the holding structure is made of a material that does not contaminate the conductive ink.

According to yet another aspect, the holding structure may be made of boron nitride BN, silicon carbide SiC, of a ceramic material, of quartz $SiO_2$, of silicon nitride SiN or of plastic.

Alternatively, the holding structure may be made of stainless steel or a metal alloy.

It is envisioned that the internal walls of said at least one reservoir will, for example, be coated with a protective layer.

Thus, the internal walls of said at least one reservoir may be coated with a layer the contact angle of which according to Young's equation is lower than 90°.

By way of example, the perforations have a diameter of between 1 μm and 500 μm.

The optical plate may be reflective or absorbent beyond the pattern permeable to radiation from said light source.

According to one embodiment, the holding structure comprises at least a first reservoir and a second reservoir.

According to one aspect, the first and second reservoirs are filled with a different conductive fluid.

According to another aspect, at least one of the first and second reservoirs is empty in order to allow an ablation, doping or annealing treatment to be carried out using the radiation from said light source.

Provision may be made for each reservoir to comprise a continuous supply of conductive fluid and a drain for the surplus conductive fluid.

The conductive fluid is for example an ink containing silver, nickel, copper and/or aluminum, based on water or another solvent.

The invention also relates to a device for depositing at least one material on a substrate, characterized in that it comprises a light source and a deposition matrix such as defined above.

This device may comprise optical means for focusing a light beam from said source on the optical plate.

According to another aspect, the device comprises optical means for obtaining a parallel light beam from said source at the optical plate.

According to yet another aspect, said light source is chosen from the group formed by a laser, a light-emitting diode and a lamp.

The invention furthermore relates to a process for depositing on a substrate at least one fluid that contains a conductive material/conductive particles and has a viscosity sensitive to radiation from a light source in order to form conductive tracks or contacts on the substrate, characterized in that:

a deposition matrix such as defined above is positioned above the substrate; and the conductive fluid contained in at least one reservoir of said holding structure is exposed to radiation from a light source through an interposed optical plate so as to locally fluidify said conductive fluid so that the latter flows through perforations produced in the bottom wall of the holding structure and deposits in a preset pattern.

This process for forming conductive tracks or contacts on a substrate is very precise since the alignment problems of the prior art are solved, especially as the perforations are produced according to a pattern of the fluid to be deposited on the substrate. Furthermore, the optical plate allows the light radiation that activates the conductive fluid to be patterned.

According to one aspect, said light source is a laser and said optical plate is scanned with the light beam.

According to one embodiment, it is envisioned that the entire area of said optical plate will be illuminated simultaneously.

Other advantages and features will become apparent on reading the description of the following figures, in which:

In all the figures the same references relate to the same elements.

FIG. 1 shows a diagram of a device 1 for depositing at least one material on a substrate 3 in order to produce metal contacts, for example in the context of the production of photovoltaic cells.

Figure 1:
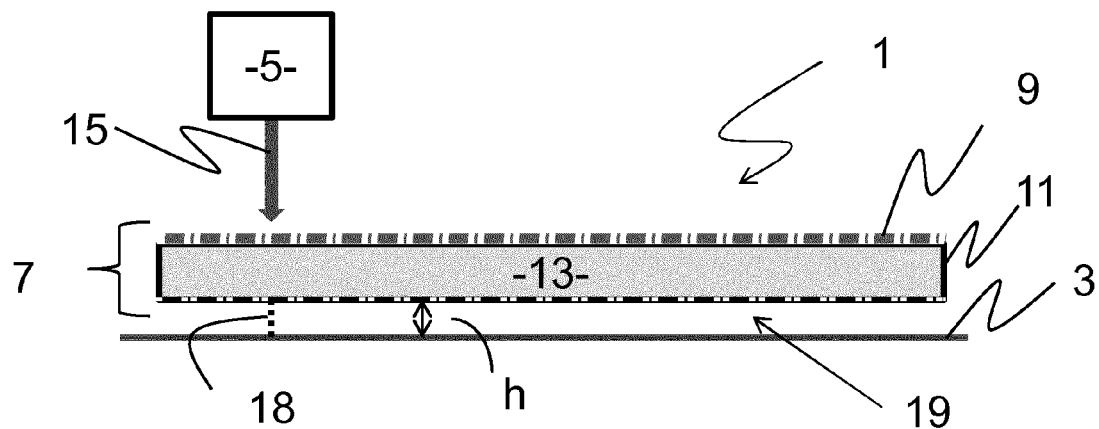
FIG. 1 shows a diagram of a device for depositing at least one material on a substrate.

This device comprises a light source 5 and a deposition matrix 7 formed, in the example embodiment in FIG. 1, on the one hand by an optical plate 9 and on the other hand by a structure 11 for holding at least one fluid 13 that is conductive and has a viscosity sensitive to radiation 15 from the light source 5, for depositing said fluid 13 on the substrate 3 in order to form conductive tracks or contacts on the substrate 3.

The conductive fluid 13 having a viscosity sensitive to radiation is for example a specific ink, for example a silver, nickel, copper or aluminum ink, based on water or another solvent for producing localized contacts for solar cells.

The fluid 13 may be conducted because it contains conductive metal filler particles.

When a fluid is said to have a viscosity sensitive to radiation from the light source 5, what is meant is that the viscosity of the fluid decreases locally at the point of impact of the radiation 15 of the light source 5. This may be due to a light sensitivity effect, i.e. an effect dependent above all on the wavelength of the light, or on a heat sensitivity effect, i.e. the radiation 15 locally heats the conductive fluid 13 making the latter less viscous.

Of course, any conductive fluid or fluid containing conductive particles having similar properties may also be chosen.

The light source 5 is for example a laser, a light-emitting diode or a lamp.

What is important is for the wavelength and/or light intensity of the light source 5 to be chosen so that the impact of the light from the source on the conductive fluid, for example an ink, modifies, especially via a light or heat sensitivity effect, the viscosity of the conductive fluid and makes it less viscous.

A laser or a laser diode is advantageously used by way of a light source 5 as they emit high-intensity radiation 15 at one or more well-defined wavelengths that may be easily directed relative to the optical plate 9 and the holding structure 11. As will be seen below, the light beam must then be scanned over the optical plate 9 or over the holder without optical plate in order to deposit metal on the substrate 3.

If a light-emitting diode, a matrix of light-emitting diodes or a lamp is used, the deposition matrix 7 formed from the carrier with the optical plate 9 may be illuminated at the same time, thereby allowing the deposition process to be accelerated. Specifically, the deposition matrix 7 is uniformly illuminated in this way for long enough to allow the conductive fluid 13 to flow and deposit on the substrate 3.

Of course, it may be envisioned, depending on the light source chosen, to use optical means (not shown), such as for example lenses, to focus a light beam from said source on the optical plate 11.

Similarly, in particular with a laser as light source 5, divergent optical means (not shown) may be used to obtain a parallel light beam from said source 5 at the optical plate 11, in order to illuminate the latter completely.

Of course, these optical means may be composed of a plurality of lenses, prisms or other optical elements for directing the light ray 15 from the source 5 toward the deposition matrix 7.

The deposition matrix 7 will now be described in greater detail with regard to FIGS. 2 to 5.

Figure 3A:
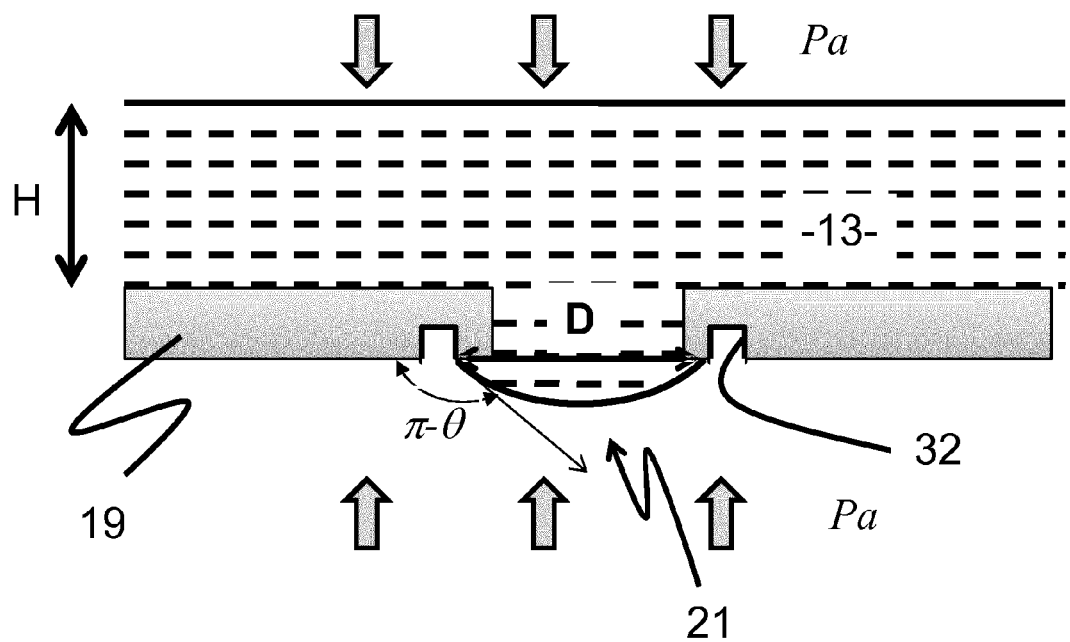
FIG. 3a shows a schematic diagram in relation to FIG. 3.
Figure 2:
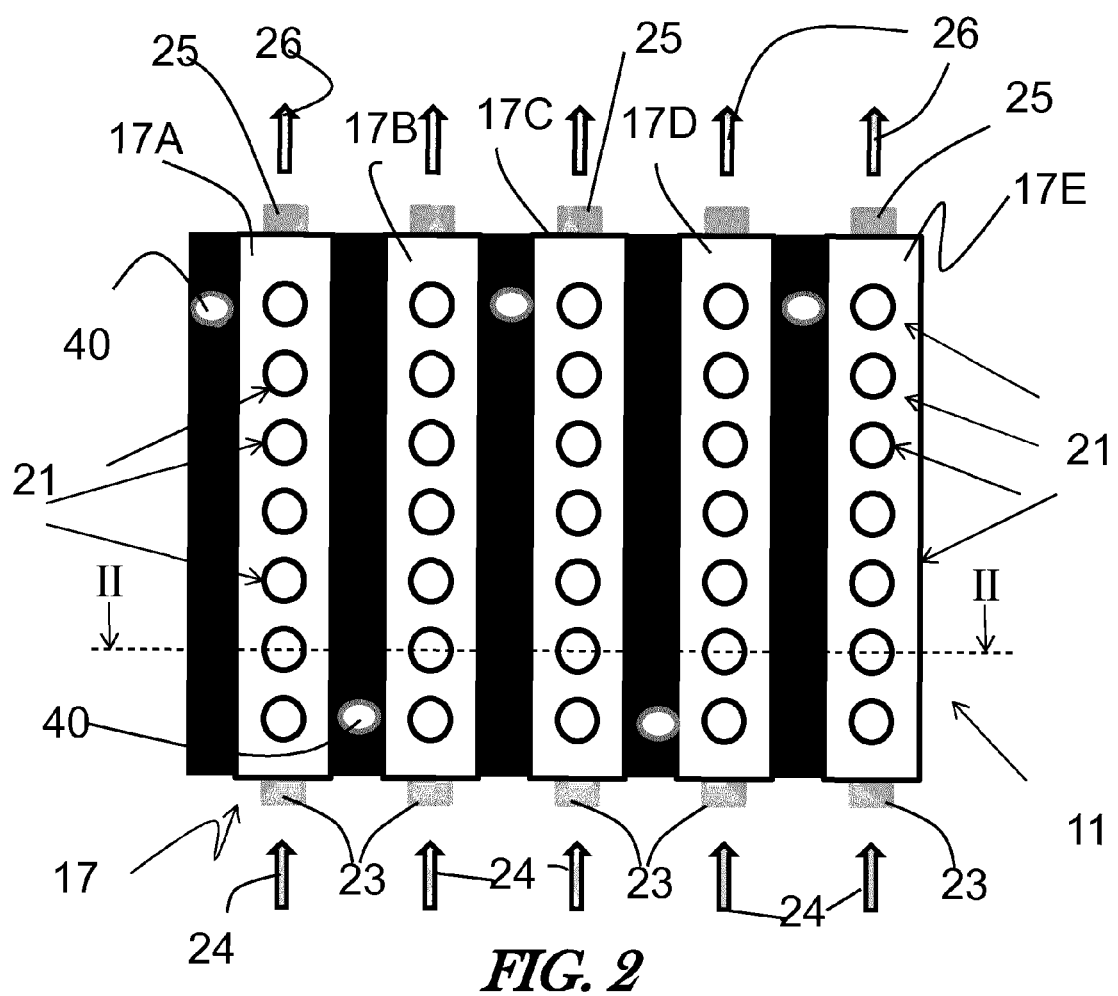
FIG. 2 shows a more detailed diagram of a deposition matrix according to one embodiment.
Figure 3:
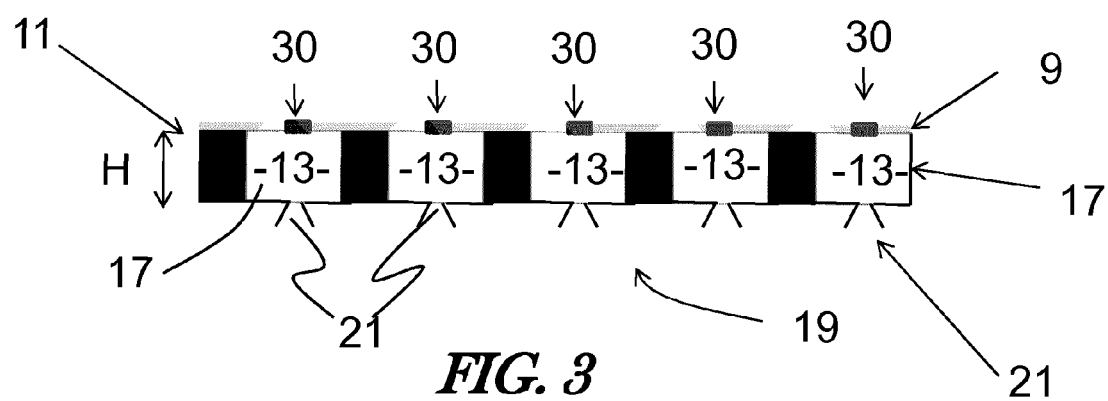
FIG. 3 shows the diagram in FIG. 2 in cross section along the line II-II.

As may be seen in FIGS. 2 and 3, the holding structure 11 comprises at least one reservoir 17 containing said conductive fluid 13, five reservoirs 17 in the present example (17A, 17B, 17C, 17D and 17E, respectively).

The bottom wall 19 of each reservoir 17 is intended to be placed facing said substrate 3 during the deposition and contains perforations 21 allowing said conductive fluid 13 to flow 18 (this flow being shown by a dotted line in FIG. 1) onto the substrate 3 when said fluid 13 is exposed to radiation from said light source 5.

Figure 4:
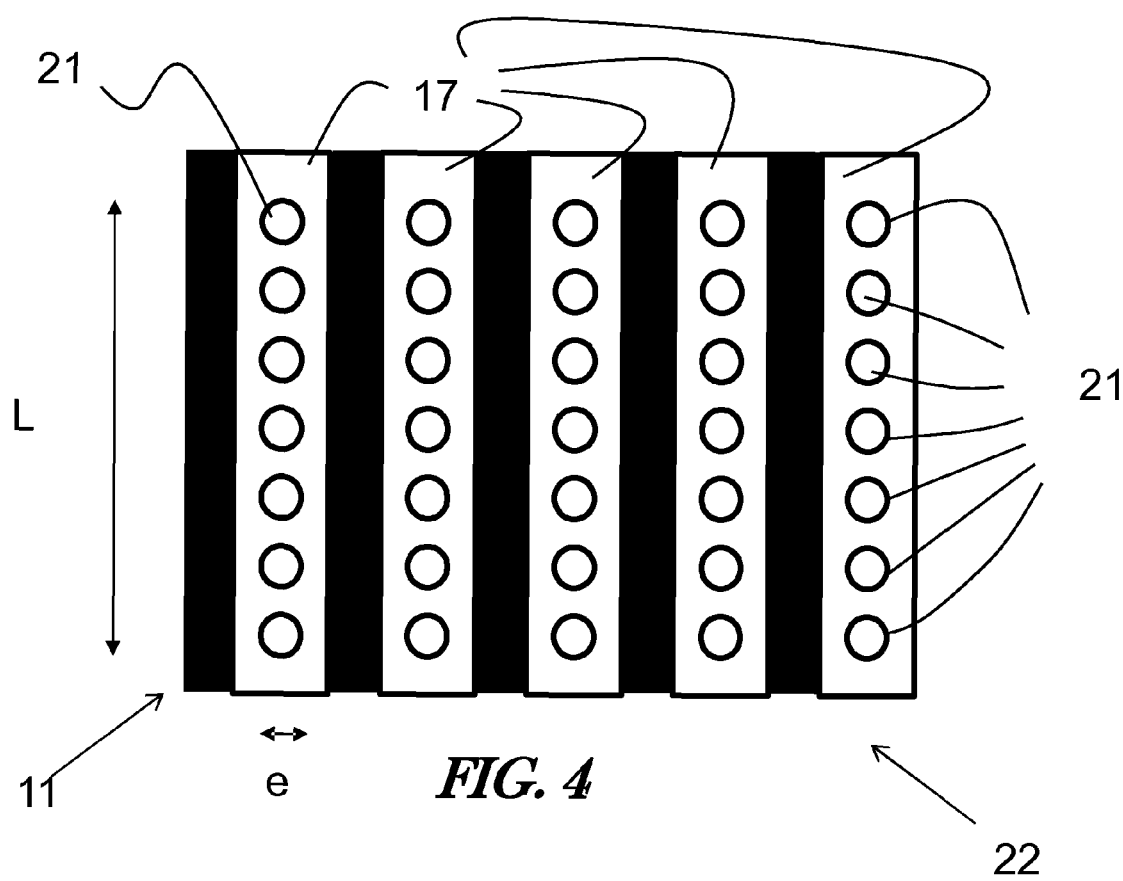
FIG. 4 shows a bottom view of an example of the holding structure of FIG. 2.

As may be seen in FIG. 4, showing the lower side of the holding structure 11, the perforations 21 are produced according to a pattern 22 of the fluid to be deposited on the substrate 3.

In the present example, the pattern 22 is composed of five rows of perforations 21 that are aligned and parallel. Of course, any sort of pattern may be envisioned depending on the requirements of the metal contacts to be produced. The pattern 22 therefore corresponds to the electrical contacts to be produced and/or to conductive tracks connecting these electrical contacts in order to collect the current delivered by the photovoltaic cells of a photovoltaic panel.

According to a first variant, the holding structure is for example made of boron nitride BN, silicon carbide SiC, of quarts $SiO_2$, of silicon nitride SiN, of a ceramic material or even of a heat-resistant plastic.

According to a second variant, the holding structure is made of stainless steel or a metal alloy.

In choosing the material of the holding structure, care will be taken to ensure that this material is a non-contaminating material so that it does not contaminate the conductive fluid 13 to be deposited on the substrate. The term "non-contaminating" is in particular understood to mean that the ink is not polluted (there is no pollution by residues of the material of the holding structure) and that there is no interaction/reaction between the holding material and the conductive ink.

In order to reinforce the protection of the conductive fluid 13, it is envisioned in certain cases that the internal walls of the reservoirs 17 will be coated with a protective layer.

To improve wetting properties, it is also envisioned that the internal walls of said holding structure will be coated with a layer the contact angle θ of which, according to Young's equation, is lower than 90°. This layer may also act as a protective layer. The layer will for example be made of boron nitride BN, silicon carbide SIC, of quartz $SiO_2$, of silicon nitride SiN, of a ceramic material or even of a heat-resistant plastic. As regards the perforations 21, they may have a diameter comprised between 1 and 500 μm. This diameter essentially depends, on the one hand, on the size/width of the metal contacts to be produced, and on the irradiated and unirradiated viscosity parameters of the conductive fluid 13. Specifically, the diameter must be small enough to contain the conductive fluid 13 by capillary action in the reservoir 17 when it is not irradiated, but large enough to allow the conductive fluid 13 to flow 18 and deposit on the substrate 3 when it is exposed to this radiation 15.

FIG. 3a shows an enlarged view of an aperture 21 of the reservoir 17 filled with conductive fluid 13.

The surface tension of the conductive fluid 13 allows a stable convex meniscus to form under each aperture and allows the conductive fluid 13 to remain in the reservoir. The condition for meniscus stability, given by the Young-Laplace equation, is $H<\sigma\cdot\sin\theta/(\rho g D)$, where H is the fluid height, $\sigma$ the surface tension, $\theta$ the contact angle, $\rho$ the density of the fluid, g the acceleration due to gravity and D the diameter of the meniscus (see FIG. 3a).

According to one optional variant (shown in FIG. 3a) a circumferential groove 32 may be provided around each aperture 21 in order to limit the spread of the meniscus and improve its stability.

The diameter of the apertures and the distance between the perforations or apertures 21 must be chosen depending on the design of the deposition.

For example, very closely spaced apertures 21 and a conductive fluid 13 having viscosity properties such that its spread over the substrate is controlled may allow a continuous line to be deposited on the substrate 3. For example, in the case of a frontside metallization of silicon solar cells, the metallization lines have a diameter of between 10 and 150 µm. The sizes of the apertures 21 are chosen in such a way that the substance is deposited roughly over this width and that, when the optical source 5 is scanned over the holding structure 11, the conductive fluid 13 deposits and spreads uniformly, thus forming a continuous line.

For example, the apertures 21 may be spaced in such a way as to make the localized deposition of backside contacts for PERC cells possible (diameter of the contact, once deposited, of between 10 and 100 µm and spacing between the contacts of between 400 µm and 1 mm).

As specified above, another parameter to take into consideration is also the height H of the conductive fluid 13 in the reservoir 17, which is for example comprised between 300 µm and 1 mm. It is only necessary for there to be a film of conductive fluid 13 on the bottom wall 19.

It proves to be very advantageous for each reservoir to comprise a continuous supply 23 (indicated by the arrows 24) of conductive fluid 13 and a drain 25 for the surplus (indicated by the arrows 26) conductive fluid 13.

Thus, the holding structure 11 may be continuously supplied, which is particularly well suitable for a continuous industrial process for producing metal contacts on a substrate, in particular in the manufacture of photovoltaic cells.

Of course, it may be a question of a loop, the conductive fluid 13 drained being reinjected into the reservoirs 17.

Thus, the device 1 is very economical in terms of the amount of conductive fluid 13 used.

The embodiment in FIG. 2 comprises a plurality of elongate reservoirs 17A to 17E.

According to another embodiment (not shown) a single reservoir 17 may be provided, this single reservoir being the same size as all the reservoirs 17A to 17E taken together.

In the embodiment in FIG. 2, all the reservoirs 17A to 17E are filled with the same conductive fluid 13.

According to another embodiment and depending on the metal deposition requirements, a first reservoir 17A is filled with a first conductive fluid and the second, reservoir 17B is filled with a different second conductive fluid. Thus, it is for example possible to alternate the conductive fluids. It is even possible to envision using three or more conductive fluids without departing from the scope of the present invention.

According to yet another embodiment, provision may be made to include empty reservoirs among the filled reservoirs. In this case, the light beam of the light source 5 may pass through the orifices 21 and reach the substrate 3 directly, for example in order to allow an ablation or annealing treatment to be carried out using the radiation from said light source 5. It may also for example be a question of a specific local laser treatment or a laser doping treatment.

Having described the holding structure 11, attention will now be turned to the optical plate 9.

Figure 5:
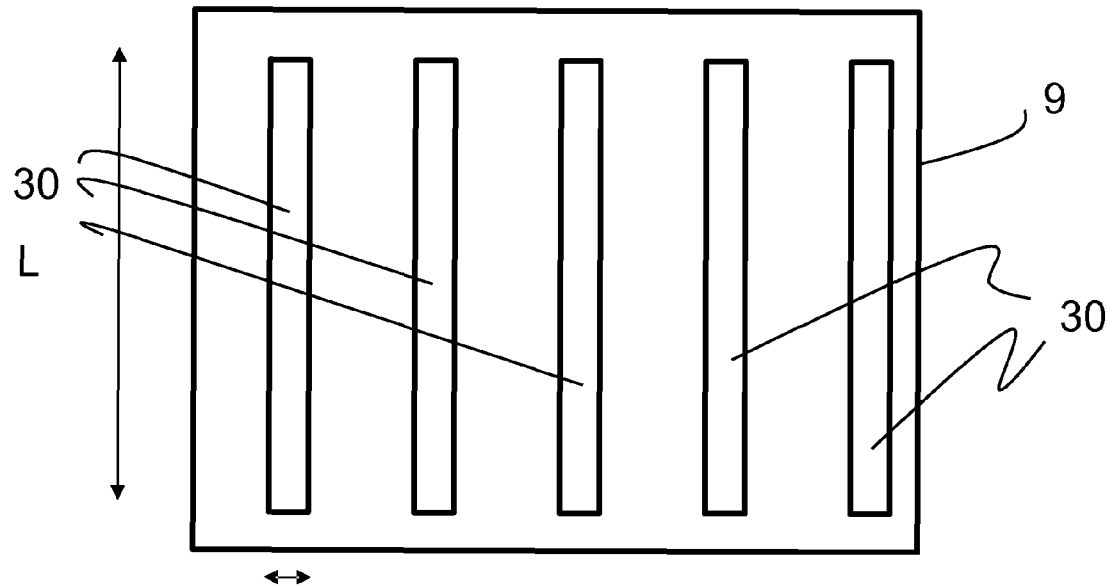
FIG. 5 shows a top view of an example of the optical plate of FIG. 2.

One example of an optical plate 9 is shown in FIG. 5. Said plate may form an upper wall of the holding structure 11 or be placed on the latter (see FIGS. 1 and 3). In the latter case, it is necessary for the material of the holding structure 11, at least as regards this upper wall, to be optically transparent to the radiation from the light source 5.

Figure 7:
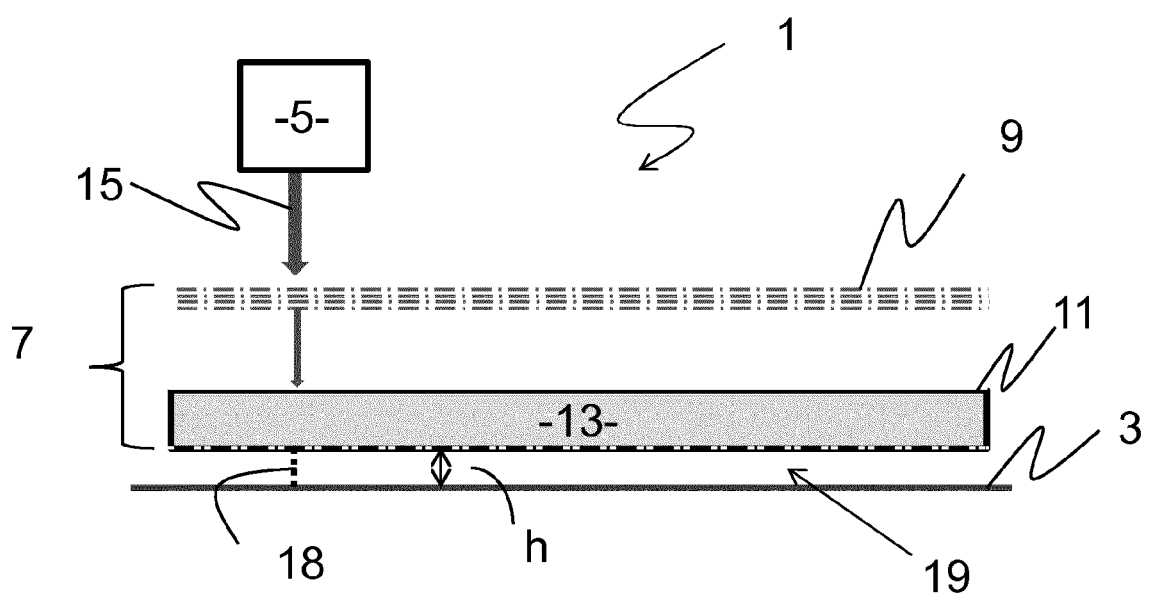
FIG. 7 shows a diagram of the deposition device according to another embodiment.

According to another embodiment shown in FIG. 7, the optical plate 9 is placed a constant distance above said holding structure. In this case, the reservoirs 17 of the holding structure may be open-topped.

In this embodiment, various reservoirs 17 may be positioned under the optical plate 9. It is therefore possible, depending on the pattern of the optical plate covering the patterns of perforations in the holding structure, to treat various types of conductive fluids with the same optical plate/light source assembly.

The plate 9 is patterned with a pattern 30 permeable to radiation from said light source 5 and the plate 9 is impermeable to radiation from said light source beyond said pattern 30. The pattern 30 corresponds to a pattern covering the pattern 22 of the perforations.

The expression "impermeable to radiation from the light source 5" is understood to mean that this radiation is either absorbed or reflected.

The expression "permeable to radiation" is understood to mean that the light from the source 5 is mainly transmitted through the optical plate 9.

The pattern 30 of the optical plate 9 covers the pattern 22 of the perforations 21.

Thus, as may be seen in FIG. 5, the pattern 30 is formed by five strips the width e of which corresponds to the diameter of the perforations 21 and the length L of which corresponds to the distance between the end holes.

However, in particular in the case where the optical plate 9 is placed a distance away from the holding structure 11, it is necessary to take account of the projection of the radiation from the source through the optical plate 9 onto the perforations 21 in order to achieve, level with the perforations 21, an intensity that is sufficient to decrease the viscosity of the conductive fluid 13 and allow it to flow 18 and deposit on the substrate 3.

According to other embodiments, provision may be made for the patterns 22 and 30 to be identical, in particular if the light source 5 is a laser.

According to a first variant, the optical plate is therefore reflective or absorbent beyond the pattern 30 permeable to radiation from said light source.

According to a second variant, the optical plate is coated with a filtering coating level with a pattern 30 permeable to radiation from said light source 5. It may for example be a question of band-rejection filters (aka notch filters) level with the pattern 30 permeable to radiation from said light source. These filters may for example be different, i.e. possess different rejection bands, in various locations of the optical plate 9 in order to allow for specific local treatment of the substrate 3 as a function of location, for example in order to allow a conductive fluid 13 to be fluidified in order to deposit it on the substrate 3, or to allow metal deposited on the substrate to be treated. If for example there are a plurality of reservoirs 17 containing different conductive fluids, or indeed one reservoir 17 contains no conductive fluid, the pattern 30 takes account thereof via the spectral and/or spatial response of the band-rejection filters above each reservoir.

By providing a permeable pattern 30 in the optical plate 9 that corresponds to a pattern covering the pattern 22 of the perforations 21 in said holding structure, it is possible to avoid problems with laser alignment while obtaining a high deposition precision. This opens the way to a large-scale industrial process that is inexpensive while maintaining the deposition precision required, in particular in terms of conductive track definition and thicknesses, especially for the photovoltaic field in which imprecision may lead to a loss of efficiency. Furthermore, the presence of the optical plate containing patterns covering the pattern of the perforations, it is possible to control the light radiation activating the conductive fluid.

In addition, depending on the pattern of the optical plate 9 covering the pattern 22 of the perforations 21 in said holding structure, the conductive fluid 13 may be guided/maintained at the desired pressure in the reservoir, thereby enabling greater freedom in the choice of the ink composition and its viscosity at room temperature, and in the choice of the power of the light source 5 used to decrease the viscosity of the conductive fluid 13.

The deposition device 1 functions in the following way:

The deposition matrix 7 is positioned above the substrate 3 such as described above. The substrate 3 and deposition matrix 7 may be aligned using conventional means.

The distance between the holding structure 11 and the substrate 3 must be optimized such that the conductive fluid 13 deposits on a preset area in a controlled way. During the deposition, the holding structure 11 is placed at a height greater than the thickness of the layer to be deposited so that there is no contact between them. For example, the holding structure 11 may be placed at a distance of about ten microns above the final thickness of the metal contact on the substrate 3.

The holding structure 11 may be held by electromechanical moving means (for example a movable mechanical stage or a piezoelectric stage), in particular in order to control the height h of the holder relative to the substrate 3, but also to move it in x and in y.

Next, said optical plate 9 is exposed to radiation from the light source 5 so as to locally fluidify, via light rays penetrating as far as the orifices 21, said conductive fluid 13 so that the latter flows through an orifice 21 produced in the bottom wall 19 and deposits in the preset pattern 22.

Figure 6:
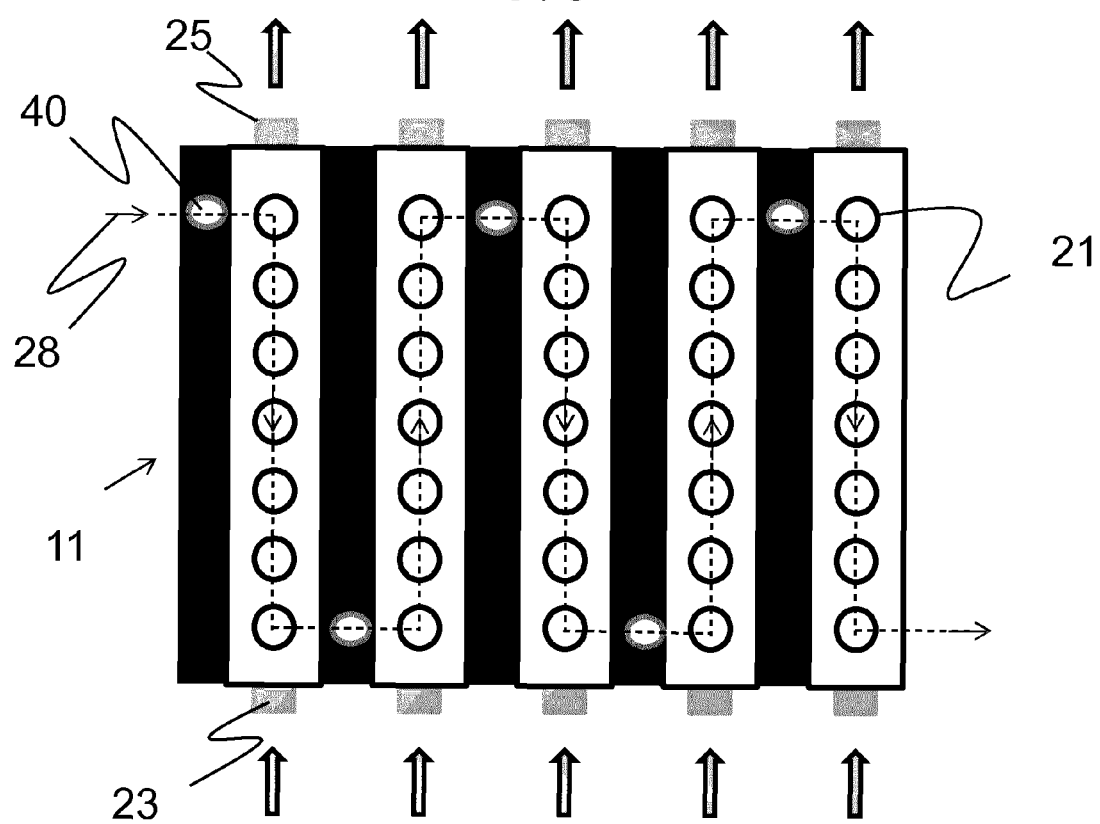
FIG. 6 is the same diagram as that in FIG. 2 showing an example laser beam scan.

For this purpose, as may be seen in FIG. 6, said optical plate is scanned with the light beam along the path 28 shown by the dotted line.

In order to control the incident energy density, intensity detectors 40 may be integrated into the holding structure 11, preferably on the path scanned by the light beam.

Of course, depending on, the light source 5, provision may also be made to illuminate the entire area of said optical plate 9 simultaneously.

It will therefore be understood that the present invention makes it possible to easily and rapidly produce metal contacts on a substrate, in particular for production of photovoltaic cells.

The invention claimed is:

1. A deposition matrix for depositing at least one electrical conductive and metallization fluid on one or more surfaces of a substrate to form one or more conductive tracks or one or more conductive contacts on at least a first one of the one or more surfaces of the substrate, said deposition matrix having an upper face and a lower face, wherein the upper face corresponds to a first surface of said deposition matrix and the lower face corresponds to a second opposing surface of said deposition matrix, the at least one electrical conductive and metallization fluid having a viscosity responsive to radiation emitted by a light source, the light source spaced apart from the upper face of said deposition matrix by a predetermined distance, said deposition matrix comprising:

a holding structure having first and second opposing surfaces, wherein the second surface of said holding structure corresponds to the lower face of said deposition matrix, said holding structure comprising:

at least one reservoir for storing the at least one electrical conductive and metallization fluid, the at least one reservoir having a top wall proximate the first surface of said holding structure and a bottom wall proximate the second surface of said holding structure, wherein the top wall corresponds to a first surface of the at least one reservoir and the bottom wall corresponds to a second opposing surface of the at least one reservoir, the bottom wall of the at least one reservoir spaced apart from the one or more surfaces of the substrate by a predetermined distance and having one or more perforations extending at least partially through a thickness of the bottom wall to allow the at least one electrical conductive and metallization fluid to flow onto the one or more surfaces of the substrate when the conductive fluid is exposed to radiation, the one or more perforations having a first pattern corresponding to a second pattern of the one or more conductive tracks or the one or more conductive contacts to be formed on at least the first one of the one or more surfaces of the substrate; and an optical plate having first and second opposing surfaces, wherein the first surface of said optical plate corresponds to the upper face of said deposition matrix and the second surface of said optical plate is deposited over and spaced apart from the first surface of said holding structure by a predetermined distance, said optical plate having a third pattern permeable to radiation, the third pattern corresponding to the first pattern of the one or more perforations in the bottom wall of the at least one reservoir and the predetermined distance with which the second surface of said optical plate is spaced apart from the first surface of said holding structure;

wherein the first and third patterns are aligned with each other such that the third pattern covers the first pattern.

2. The deposition matrix of claim 1 wherein the top wall of the at least one reservoir has an open surface.

3. The deposition matrix of claim 1 wherein said holding structure comprises a material that does not contaminate the electrical conductive and metallization fluid.

4. The deposition matrix of claim 1 wherein said holding structure comprises a material that includes one or more of boron nitride (BN), silicon carbide (SiC), a ceramic material, silicon dioxide ($SiO_2$), silicon nitride (SiN) or a plastic material.

5. The deposition matrix of claim 1 wherein said holding structure comprises a material that includes one or more of stainless steel or a metal alloy.

6. The deposition matrix of claim 1 wherein interior surfaces of the at least one reservoir are coated with a protective layer.

7. The deposition matrix of claim 1 wherein interior surfaces of the at least one reservoir are coated with a layer having a contact angle that is less than ninety-degrees (90°).

8. The deposition matrix of claim 1 wherein the one or more perforations of the at least one reservoir have a diameter of between about one (1) micrometer (μm) and about five-hundred (500) μm.

9. The deposition matrix of claim 1 wherein the predetermined distance between the second surface of said optical plate and the first surface of said holding structure is zero such that said optical plate abuts the first surface of said holding structure.

10. The deposition matrix of claim 1 wherein said optical plate comprises a material that is reflective or absorbent to radiation.

11. The deposition matrix of claim 1 wherein one or more surfaces of said optical plate are coated with a layer having a filtering characteristic.

12. The deposition matrix of claim 11 wherein the layer having a filtering characteristic comprises one or more optical filters.

13. The deposition matrix of claim 1 wherein the at least one reservoir comprises at least a first reservoir and a second reservoir.

14. The deposition matrix of claim 13 wherein the first reservoir is configured to store a first type of electrical conductive and metallization fluid and the second reservoir is configured to store a second, different type of electrical conductive and metallization fluid.

15. The deposition matrix of claim 13 wherein at least one of the first and second reservoirs is substantially empty in order to allow an ablation, doping or annealing treatment to be performed using received radiation.

16. The deposition matrix of claim 1 wherein each of the at least one reservoir comprises a drain for storing surplus electrical conductive and metallization fluid.

17. The deposition matrix of claim 1 wherein a diameter of the one or more perforations of the at least one reservoir is selected based upon viscosity parameters of the electrical conductive and metallization fluid and dimensions of the one or more conductive tracks or the one or more conductive contacts to be produced.

18. A device for depositing at least one electrical conductive and metallization fluid on one or more surfaces of a substrate to form one or more conductive tracks or one or more conductive contacts on at least a first one of the one or more surfaces of the substrate, said device comprising:
  a light source; and
  a deposition matrix, the deposition matrix having an upper face and a lower face, wherein the upper face corresponds to a first surface of said deposition matrix and the lower face corresponds to a second opposing surface of said deposition matrix, the at least one electrical conductive and metallization fluid having a viscosity responsive to radiation emitted by the light source, the light source spaced apart from the upper face of said deposition matrix by a predetermined distance, said deposition matrix comprising:
    a holding structure having first and second opposing surfaces, wherein the second surface of said holding structure corresponds to the lower face of said deposition matrix, said holding structure comprising:
      at least one reservoir for storing the at least one electrical conductive and metallization fluid, the at least one reservoir having a top wall proximate the first surface of said holding structure and a bottom wall proximate the second surface of said holding structure, wherein the top wall corresponds to a first surface of the at least one reservoir and the bottom wall corresponds to a second opposing surface of the at least one reservoir, the bottom wall of the at least one reservoir spaced apart from the one or more surfaces of the substrate by a predetermined distance and having one or more perforations extending at least partially through a thickness of the bottom wall to allow the at least one electrical conductive and metallization fluid to flow onto the one or more surfaces of the substrate when the electrical conductive and metallization fluid is exposed to radiation, the one or more perforations having a first pattern corresponding to a second pattern of the one or more conductive tracks or the one or more conductive contacts to be formed on at least the first one of the one or more surfaces of the substrate; and
    an optical plate having first and second opposing surfaces, wherein the first surface of said optical plate corresponds to the upper face of said deposition matrix and the second surface of said optical plate is deposited over and spaced apart from the first surface of said holding structure by a predetermined distance, said optical plate having a third pattern permeable to radiation, the third pattern corresponding to the first pattern of the one or more perforations in the bottom wall of the at least one reservoir and the predetermined distance with which the second surface of said optical plate is spaced apart from the first surface of said holding structure;
    wherein the first and third patterns are aligned with each other such that the third pattern covers the first pattern.

19. The device of claim 18 further comprising optical means for focusing radiation emitted from said light source at the first surface of said optical plate, said optical means spaced apart from the first surface of the optical plate by a predetermined distance.

20. The device of claim 18 further comprising optical means for obtaining a parallel light beam from said light source at the first surface of said optical plate, said optical means spaced apart from the first surface of the optical plate by a predetermined distance.

21. A process for depositing at least one electrical conductive and metallization fluid on one or more surfaces of a substrate to form one or more conductive tracks or one or more conductive contacts on at least a first one of the one or more surfaces of the substrate, the at least one electrical conductive and metallization fluid having a viscosity responsive to radiation emitted by a light source, the process comprising:
  positioning a deposition matrix above at least a first one of the one or more surfaces of the substrate, said deposition matrix having an upper face and a lower face, wherein the upper face corresponds to a first surface of the deposition matrix and the lower face corresponds to a second opposing surface of the deposition matrix, said deposition matrix comprising:
    a holding structure having first and second opposing surfaces, wherein the second surface of said holding structure corresponds to the lower face of said deposition matrix, said holding structure comprising:
      at least one reservoir for storing the at least one electrical conductive and metallization fluid, the at least one reservoir having a top wall proximate the first surface of said holding structure and a bottom wall proximate the second surface of said holding structure, wherein the top wall corresponds to a first surface of the at least one reservoir and the bottom wall corresponds to a second opposing surface of the at least one reservoir, the bottom wall of the at least one reservoir spaced apart from the one or more surfaces of the substrate by a predetermined distance and having one or more perforations extending at least partially through a thickness of the bottom wall to allow the at least one electrical conductive and metallization fluid to flow onto the one or more surfaces of the substrate when the electrical conductive and metallization fluid is exposed to radiation, the one or more perforations having a first pattern corresponding to a second pattern of the one or more conductive tracks or the one or more conductive contacts to be formed on at least the first one of the one or more surfaces of the substrate; and an optical plate having first and second opposing surfaces, wherein the first surface of said optical plate corresponds to the upper face of said deposition matrix and the second surface of said optical plate is deposited over and spaced apart from the first surface of said holding structure by a predetermined distance, said optical plate having a third pattern permeable to radiation, the third pattern corresponding to the first pattern of the one or more perforations in the bottom wall of the at least one reservoir and the predetermined distance with which the second surface of said optical plate is spaced apart from the first surface of said holding structure; and exposing the at least one electrical conductive and metallization fluid contained in the at least one reservoir of said holding structure to radiation emitted by the light source through said optical plate such that the at least one fluid flows through the perforations in the bottom wall of the at least one reservoir and is deposited on one or more surfaces of the substrate to form one or more conductive tracks or one or more conductive contacts on at least the first one of the one or more surfaces of the substrate, wherein the light source is spaced apart from the upper face of the deposition matrix by a predetermined distance;

wherein the first and third patterns are aligned with each other such that the third pattern covers the first pattern.

22. The process of claim 21 wherein exposing the at least one electrical conductive and metallization fluid contained in the at least one reservoir of said holding structure to radiation emitted by the light source through said optical plate comprises:

emitting a light beam from said light source onto said optical plate, wherein said light source is provided as a laser.

23. The process of claim 21 wherein exposing the at least one electrical conductive and metallization fluid contained in the at least one reservoir of said holding structure to radiation emitted by the light source through said optical plate comprises:

illuminating substantially all surfaces of said optical plate substantially simultaneously.

* * * * *